United States Patent
Kassir et al.

(10) Patent No.: US 7,018,268 B2
(45) Date of Patent: Mar. 28, 2006

(54) PROTECTION OF WORK PIECE DURING SURFACE PROCESSING

(75) Inventors: Salman Moudrek Kassir, Paso Robles, CA (US); Larry A. Spiegel, Pismo Beach, CA (US)

(73) Assignee: Strasbaugh, San Luis Obispo, CA (US)

( * ) Notice: Subject to any disclaimer, the term of this patent is extended or adjusted under 35 U.S.C. 154(b) by 0 days.

(21) Appl. No.: 10/249,433

(22) Filed: Apr. 8, 2003

(65) Prior Publication Data

US 2003/0211813 A1 Nov. 13, 2003

Related U.S. Application Data

(60) Provisional application No. 60/371,388, filed on Apr. 9, 2002.

(51) Int. Cl.
*B24B 49/00* (2006.01)

(52) U.S. Cl. .......................... 451/5; 451/41; 451/289; 451/388

(58) Field of Classification Search ................ 451/5, 451/41, 29, 31, 287–290, 388, 36
See application file for complete search history.

(56) References Cited

U.S. PATENT DOCUMENTS

| | | | |
|---|---|---|---|
| 2,102,597 A * | 12/1937 | Mable .................. 52/203 |
| 3,930,914 A | 1/1976 | Hetrich | |
| 3,962,832 A | 6/1976 | Strasbaugh | |
| 3,986,433 A | 10/1976 | Walsh et al. | |
| 4,009,540 A | 3/1977 | Uijen | |
| 4,165,584 A | 8/1979 | Scherrer | |
| 4,317,301 A * | 3/1982 | Timphony et al. ............ 38/102 |
| 4,380,412 A | 4/1983 | Walsh | |
| 4,441,791 A | 4/1984 | Hornbeck | |
| 4,493,606 A | 1/1985 | Foulke et al. | |
| 4,521,995 A | 6/1985 | Sekiya | |
| 4,583,325 A | 4/1986 | Tabuchi | |
| 4,597,228 A | 7/1986 | Koyama et al. | |
| 4,607,182 A | 8/1986 | Ballhaus | |
| 4,615,762 A | 10/1986 | Jastrzebski et al. | |
| 4,625,463 A | 12/1986 | Sekiya | |

(Continued)

FOREIGN PATENT DOCUMENTS

DE 199312 12/1917

(Continued)

OTHER PUBLICATIONS www.majestech.com/document/EN/SaatiTech/products/Fabrics/Home.flash.html, retrieved May 29, 2003.

(Continued)

*Primary Examiner*—M. Rachuba
(74) *Attorney, Agent, or Firm*—Thomas F. Lebens; Sinsheimer, Schiebelhut & Baggett

(57) ABSTRACT

The present invention provides an apparatus and method for protecting a work piece during surface processing. The apparatus employs a protective material to protect a wafer during backside grinding. The apparatus can further include a vacuum chuck that allows the passage of a vacuum signal, a frame holding the protective material, a frame holder to hold the frame, and a fastening arrangement to fasten the frame holder to the chuck adjacent a support surface. The method provided by the invention can include providing a vacuum chuck, placing a protective material in contact with the chuck, placing a wafer in contact with the protective material, applying a vacuum signal securing the wafer with the chuck, and grinding the backside surface of the wafer.

28 Claims, 6 Drawing Sheets

U.S. PATENT DOCUMENTS

| | | | |
|---|---|---|---|
| 4,637,369 A | 1/1987 | Petermann et al. | |
| 4,662,746 A | 5/1987 | Hornbeck | |
| 4,667,944 A | 5/1987 | Althouse | |
| 4,710,732 A | 12/1987 | Hornbeck | |
| 4,850,472 A | 7/1989 | Liebel et al. | |
| 4,861,462 A * | 8/1989 | Lehmann et al. | 209/269 |
| 4,881,518 A | 11/1989 | Feldmeier | |
| 4,896,459 A | 1/1990 | Brandt | |
| 4,946,716 A | 8/1990 | Corrie | |
| 4,956,619 A | 9/1990 | Hornbeck | |
| 4,967,461 A | 11/1990 | Feldmeier | |
| 4,967,725 A | 11/1990 | Hinzen | |
| 5,026,178 A | 6/1991 | Ballhaus | |
| 5,061,049 A | 10/1991 | Hornbeck | |
| 5,083,857 A | 1/1992 | Hornbeck | |
| 5,105,147 A | 4/1992 | Karasikov et al. | |
| 5,161,332 A | 11/1992 | Koch | |
| 5,285,597 A | 2/1994 | Hinzen | |
| 5,345,170 A | 9/1994 | Schwindt et al. | |
| 5,424,224 A | 6/1995 | Allen et al. | |
| 5,445,559 A | 8/1995 | Gale et al. | |
| 5,535,047 A | 7/1996 | Hornbeck | |
| 5,584,746 A | 12/1996 | Tanaka et al. | |
| 5,605,489 A | 2/1997 | Gale et al. | |
| 5,632,667 A | 5/1997 | Earl et al. | |
| 5,698,474 A | 12/1997 | Hurley | |
| 5,731,243 A | 3/1998 | Peng et al. | |
| 5,783,835 A | 7/1998 | Hollman et al. | |
| 5,786,236 A | 7/1998 | Thompson et al. | |
| 5,795,990 A | 8/1998 | Gitis et al. | |
| 5,799,994 A | 9/1998 | Tsai et al. | |
| 5,883,522 A | 3/1999 | O'Boyle | |
| 5,888,883 A | 3/1999 | Sasaki et al. | |
| 5,938,512 A | 8/1999 | Takei et al. | |
| 5,959,461 A | 9/1999 | Brown et al. | |
| 5,961,169 A | 10/1999 | Kalenian et al. | |
| 5,964,646 A | 10/1999 | Kassir et al. | |
| 5,964,952 A | 10/1999 | Kunze-Concewitz | |
| 6,017,822 A | 1/2000 | Mountain | |
| 6,022,807 A | 2/2000 | Lindser, Jr. et al. | |
| 6,036,587 A | 3/2000 | Tolles et al. | |
| 6,043,458 A | 3/2000 | Fortune | |
| 6,045,716 A | 4/2000 | Walsh et al. | |
| 6,050,880 A | 4/2000 | Kato et al. | |
| 6,056,632 A | 5/2000 | Mitchel et al. | |
| 6,072,157 A | 6/2000 | Klebanoff et al. | |
| 6,083,090 A | 7/2000 | Bamba | |
| 6,083,811 A | 7/2000 | Riding et al. | |
| 6,102,057 A | 8/2000 | Vogtmann et al. | |
| 6,107,107 A | 8/2000 | Bruce et al. | |
| 6,120,360 A | 9/2000 | Ball et al. | |
| 6,131,589 A | 10/2000 | Vogtmann et al. | |
| 6,139,953 A | 10/2000 | Nagamoto et al. | |
| 6,146,242 A | 11/2000 | Treur et al. | |
| 6,171,163 B1 * | 1/2001 | Seko et al. | 445/24 |
| 6,183,341 B1 | 2/2001 | Melcer | |
| 6,193,586 B1 | 2/2001 | Park et al. | |
| 6,225,235 B1 | 5/2001 | Kunze-Concewitz | |
| 6,227,956 B1 | 5/2001 | Halley | |
| 6,245,587 B1 | 6/2001 | Vallett | |
| 6,251,551 B1 | 6/2001 | Kunze-Concewitz | |
| 6,251,705 B1 | 6/2001 | Degani et al. | |
| 6,254,155 B1 | 7/2001 | Kassir | |
| 6,255,741 B1 * | 7/2001 | Yoshihara et al. | 257/792 |
| 6,257,953 B1 | 7/2001 | Gitis et al. | |
| 6,273,794 B1 | 8/2001 | Tietz et al. | |
| 6,273,804 B1 | 8/2001 | Numoto | |
| 6,281,025 B1 | 8/2001 | Ring et al. | |
| 6,294,395 B1 | 9/2001 | Birdsley et al. | |
| 6,297,131 B1 * | 10/2001 | Yamada et al. | 438/464 |
| 6,303,396 B1 | 10/2001 | Ring et al. | |
| 6,303,399 B1 | 10/2001 | Engelmann et al. | |
| 6,303,469 B1 | 10/2001 | Larson et al. | |
| 6,320,269 B1 | 11/2001 | Chen et al. | |
| 6,321,739 B1 | 11/2001 | Roberts | |
| 6,324,918 B1 | 12/2001 | Gitis et al. | |
| 6,335,628 B1 | 1/2002 | Schwindt et al. | |
| 6,336,849 B1 | 1/2002 | Konnemann | |
| 6,344,402 B1 * | 2/2002 | Sekiya | 438/460 |
| 6,346,036 B1 | 2/2002 | Halley | |
| 6,358,129 B1 | 3/2002 | Dow | |
| 6,361,647 B1 | 3/2002 | Halley | |
| 6,363,798 B1 | 4/2002 | Gitis et al. | |
| 6,371,840 B1 | 4/2002 | Ball et al. | |
| 6,379,235 B1 | 4/2002 | Halley | |
| 6,380,751 B1 | 4/2002 | Harwood et al. | |
| 6,398,892 B1 * | 6/2002 | Noguchi et al. | 156/85 |
| 6,418,776 B1 | 7/2002 | Gitis et al. | |
| 6,450,860 B1 | 9/2002 | Halley | |
| 6,464,574 B1 | 10/2002 | Halley | |
| 6,527,627 B1 | 3/2003 | Arai | |
| 2001/0049256 A1 | 12/2001 | Arai | |

FOREIGN PATENT DOCUMENTS

| | | |
|---|---|---|
| DE | 846663 | 8/1952 |
| DE | 912057 | 5/1954 |
| DE | 2819828 | 11/1978 |
| DE | 3438755 A1 | 4/1986 |
| DE | 3804962 C1 | 7/1989 |
| DE | 3804963 C1 | 7/1989 |
| DE | 3844520 A1 | 9/1989 |
| DE | 3902125 C1 | 12/1989 |
| DE | 4025511 C1 | 11/1991 |
| DE | 4208615 C1 | 2/1993 |
| DE | 4136567 A1 | 5/1993 |
| DE | 4307870 A1 | 9/1994 |
| DE | 19641534 A1 | 4/1998 |
| DE | 19815694 A1 | 10/1999 |
| DE | 10006481 A1 | 4/2001 |
| DE | 19948517 A1 | 4/2001 |
| DE | 10020103 A1 | 10/2001 |
| GB | 8214466.4 | 5/1983 |
| GB | 2190862 A | 12/1987 |
| GB | 2195275 A | 4/1988 |
| GB | 2256822 A | 12/1992 |
| JP | 59-43082 * | 3/1984 |
| JP | HEI 4-111647 | 4/1992 |
| WO | WO 99/04416 | 1/1999 |
| WO | WO 01/82339 A3 | 11/2001 |
| WO | WO 02/38336 A1 | 5/2002 |

OTHER PUBLICATIONS

G&N Twinspindle, *The MPS 2 R 400 Series, The Machine with Fully Enclosed Grinding Area, Increased Power Efficiency and Digital Control Concept*, www.grinders-us.com, retrieved Jan. 29, 2004.

Byron Knapp, Eric Marsh, Robert Grejda, David Schalcosky *Superabrasive Grinding Process Optimization through Force Measurement*, Pennsylvania State University, University Park, PA 16802, http://www.me.psu.edu/mdrl/docs/instgrind.pdf, retrieved Apr. 2, 2003.

* cited by examiner

PROTECTION OF WORK PIECE DURING SURFACE PROCESSING

CROSS REFERENCE TO RELATED APPLICATIONS

This application claims priority under 35 U.S.C. § 119(e) to U.S. Provisional Patent Application No. 60/371,388, filed Apr. 9, 2002, of Salman Moudrek Kassir and Larry A. Spiegel, for IMPROVED BACKSIDE PREPARATION OF SEMICONDUCTOR WAFERS, which U.S. Provisional Patent Application is hereby fully incorporated herein by reference.

BACKGROUND OF INVENTION

The present invention pertains to the support of work pieces such as semiconductor wafers, and in particular to support of work pieces during grinding or polishing. Presently, conventional semiconductor wafers on which circuit patterns are formed on one side (a front side) are subjected to a grinding process so as to reduce the overall thickness of the wafer. Grinding is performed on the back surface of the wafer where there is no circuitry pattern. The resultant thinning of the wafer allows for the production of thinner packaged electronic chips, microchips, and the like. Additionally, the thinning facilitates backside inspection of the wafer, such as by examining infrared optical and thermal emissions from the backside of the wafer, resulting from the selective excitation of devices on the front side of the wafer. In some instances, the thickness of a microchip cannot exceed a predefined thickness. Various other advantages are achieved by reducing the thickness of the wafers.

One industry technique for grinding the backside of a wafer is to use a taping tool to apply a tape layer to the front side of the wafer using adhesive in order to cover and protect the circuitry devices on the front side of the wafer during backside grinding. The front side of the wafer, with the tape adhered thereto, is then placed against a chuck of a grinding system and held in place, such as with a vacuum applied through holes, pores, channels or the like in the chuck. Backside grinding is then accomplished using a grinding wheel of a grinding system, which is applied to the backside of the wafer using a force and with a relative rotational force. Following grinding, the front side of the wafer is de-taped using a de-taping tool that pulls the tape off of the front side of the wafer prior to dicing of the wafer into chips that are then packaged and assembled.

Problematically, the taping and de-taping process results in cracking of the wafer in some cases, especially for wafers thinned below a 200 µm thickness. These cracks can be due to localized forces that are created between the tape and the wafer, or as a result of forces exerted when the tape is pulled from the front side of the wafer against the adhesive. As a result, a higher rate of failure is seen when wafers are taped and de-taped. Because of the additional steps of taping and de-taping, and of the relatively higher rate of failure of the wafer resulting from the taping and de-taping process, taping and de-taping results in a relatively decreased wafer processing throughput.

Further, because de-taping subjects the wafer to mechanical stresses, and thus limits the thinness of the wafer due to the need to maintain at least some minimum degree of mechanical integrity sufficient to withstand the forces applied during de-taping, minimum wafer thinness has heretofore been limited to 150 to 200 microns.

Further disadvantageously, the taping and de-taping processes add cost due to equipment, and require valuable floor space for taping and de-taping equipment.

SUMMARY OF INVENTION

Several trends have been noted in the semiconductor device fabrication industry. For example, wafers of larger size and higher device densities are being sought. Further, it is desired that the packaged devices have an increasingly reduced thickness. For example, smartcard technology requires microchips with a maximum thickness.

Inspection of these wafers, for example, is desirably conducted by viewing emissions, such as infrared emissions and/or thermal emissions, observed at a backside of the wafer, resulting from excitation of the devices on the front side of the wafer. In order to accurately conduct such inspections, however, significant thinning of the wafer must be effected in order to assure that such emissions are not distorted by substantial intervening wafer substrate material.

In some applications, a wafer substrate undergoes grinding to a desired thickness on the order of 25 to 150 microns, with desired wafer Total Thickness Variation (TTV) on the order of 3 microns or less. Such thinning processes are typically carried out in so-called "back grinding" or "backside grinding" operations where a wafer is placed face down with its front side (i.e., side at which devices are located) on a retention device while the exposed backside is ground, reducing the wafer thickness. The present apparatus and method additionally facilitates the use of special protective materials or tapes attached to the front surface of a wafer or work piece, which have desirable properties other than for back grinding protection. In this way these special tapes can be accommodated during back grinding since the method described herein provides back grinding protection.

It is one feature of the present invention, in some embodiments, to improve grinding and similar operations on work pieces held by hard chucks, particularly work pieces which are ground to relatively thin dimensions. It is another feature of the present invention, in some embodiments, to provide a backside grinding system that is capable of grinding a wafer to very thin dimensions without cracking the wafer. Another feature of the present invention, in some embodiments, is to provide wafer grinding techniques to reliably achieve wafer thickness of two hundred microns or less with attractive yield levels.

Yet a further feature of the present invention, in some embodiments, is to provide a front side wafer protection layer without using conventional adhesive backing tape applied to the wafer, thus eliminating issues surrounding backing tape, such as the risk of wafer breakage during tape removal, and reducing costs associated with the tape.

A further feature of the present invention, in some embodiments, is to provide wafer grinding techniques that do not require a side, e.g., a front side, of the wafer to be protected by a tape, a photo resist layer or other covering.

Another further feature of the present invention, in some embodiments, is to provide a protection/securing layer for distributing vacuum forces on the front side of a wafer. Another feature of the present invention, in some embodiments, is to provide wafer grinding techniques in which taping and de-taping of the front side surface (circuitry side) of the wafer is eliminated. An additional feature of the present invention, in some embodiments, is to provide a reusable protecting/securing protective layer. These and other features, advantages and benefits of the present invention are attained, in accordance with one embodiment, in an arrangement for supporting a wafer having opposed first and second major surfaces, during grinding of the first surface, without using protective tape to protect the second surface, including a chuck including a chuck body and a support surface; and a protective material, held fixed in relation to the support surface, wherein the second surface of the work piece is selectively held in relation to the support surface, with the protective material being interposed therebetween, whereby the second surface of the work piece is protected by the protective material during grinding of the first surface.

DETAILED DESCRIPTION

Figure 1:
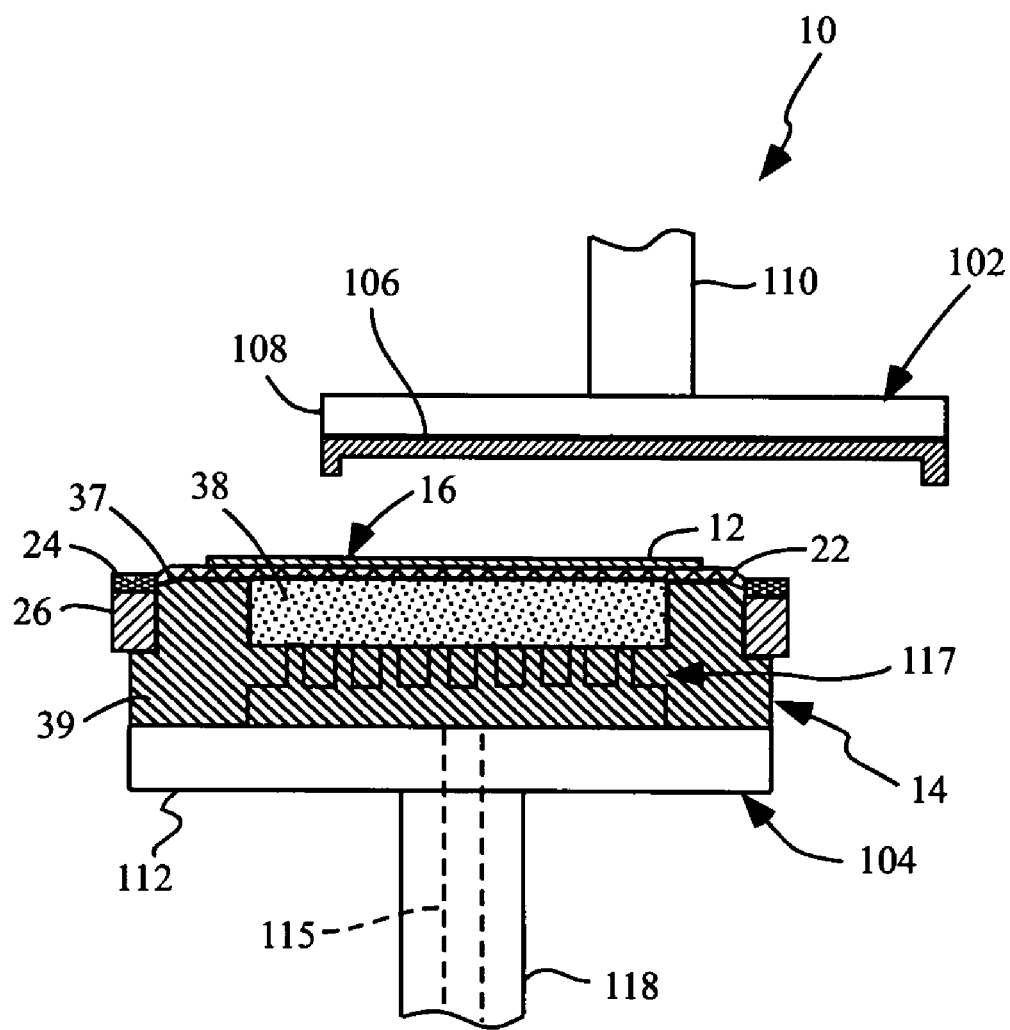
FIG. 1 is a cross-sectional view of a wafer backside grinding system in accordance with one embodiment of the present invention.

As will be seen herein, the present embodiment offers substantial improvements in the field of semiconductor grinding or polishing on either the front or backside of a wafer being processed. The present embodiment has found immediate commercial application in the field of wafer thinning, which is typically carried out on the backside of the wafer. The present embodiment provides a number of important advantages by at least in part eliminating the need for taping and de-taping procedures, including increased production speeds, increased end product throughput, reduced costs, as well as other advantages and enhancements.

In previous grinding systems, wafer taping procedures utilizing protective tape can achieve minimum wafer thicknesses down to about 180 microns with a total thickness variation (TTV) of 4 to 5 microns. The present embodiment also eliminates the need for coating a front wafer surface with a spun photo resist. With the present embodiment, minimum wafer thicknesses of less than 180 microns, preferably less than 150 microns, and most preferably less than 100 microns, e.g., 70 microns or less are reliably achievable with acceptable and often times improved yields. With the present invention, it is possible to achieve a total thickness variation of, for example, less than 4 microns, preferably 3 microns or less.

An apparatus according to principles of the present invention can be readily retrofitted to existing equipment with minimal set-up time, thereby providing substantial additional commercial advantages. In retrofitting, typically, the components of the grinding system of the present embodiment mount to previous grinding systems. The components can be secured with previous grinding systems with preexisting mounts (e.g., threaded holes). Additionally, a chuck (as described further below) employed in the present grinding system utilizes a rounded or tapered working surface peripheral edge. As such, in retrofitting previous systems, the working surface edge of chucks of previous systems are filed, broken or otherwise processed to round, chamfer, taper and/or dull the working surface edge. Retro-fitting of previous grinding systems is described fully below. If desired, the present embodiment can also be employed with the manufacture of new equipment, and commercial advantages made available by the present invention will be attained in a cost effective manner.

As will be seen herein, the present embodiment preferably employs a holder attached to, for example, a conventional vacuum chuck. In one embodiment, a mesh material is provided in the form of a protective pad held by a frame.

The protective material may be provided in other forms, if desired, for example, the protective pad may be a perforated tape held against the chuck with or without an adhesive (instead of or in addition to the frame and holder). The protective material can be configured in substantially any shape, such as circular, rectangular, square, and other shapes. In some embodiments, it is preferred that the protective material has a shape similar to the chuck and/or work piece being ground. Typically the protective material has an area greater than an area of the work piece.

The protective material is preferably made of a mesh material, (such as a mesh, e.g., a fabric or nylon, polyester material, or a perforated material, e.g., a paper) suitable for the transference of vacuum signals across its boundaries. Preferably, the mesh material is stretched or held taught or flat on or in a frame or insert, preferably in the form of a ring. If desired, the frame can take on forms other than that of a ring, e.g., a polygon. The frame is then releasably mounted to a holder, in close proximity to the bearing or support surface of the vacuum chuck. During back grinding operations, the front side surface (circuitry side) of the wafer is contacted by the protective material non-adheringly in a manner that protects the front side of the wafer during back grinding operations.

With the present embodiment, the protective material can be releasably mounted to a conventional vacuum chuck, and can be quickly replaced in a matter of minutes.

New back grinding procedures can be developed utilizing a variety of optimized protective materials. As new levels of wafer thinness are being achieved, the need for specialized, optimized protective materials arises. For example, the processing of very thin wafers requires new protective materials of well-defined compressibility, globally uniform thickness and globally uniform homogeneity.

It is generally preferred that the present embodiment be carried out using protective materials which are inherently porous, although non-porous materials can be employed if perforated beforehand or in the event a chuck other than a conventional vacuum chuck is employed. It is generally preferred that perforation steps be eliminated since they may affect protective material homogeneity. For example, perforation steps carried out using laser drilling techniques can result in laser holes having burned, hardened edges, and edges which are raised relative to the overall material surface.

The present invention, which offers substantial improvements in the field of semiconductor grinding or polishing (on either the front or backside of a wafer or other thin work piece being processed) has found immediate commercial application in the field of wafer thinning, which is typically carried out on the backside of the wafer. The present embodiment provides a number of advantages by eliminating the need for taping and de-taping procedures to secure and protect the wafer during the grinding or polishing operation. In certain aspects, the present embodiment provides improved non-adhering front side wafer securement and protection with a film layer comprising a mesh material having a plurality of vacuum holes, an apparatus for employing the mesh material (or film mesh) in a wafer backside grinding system, and a method of using the mesh material in a wafer backside grinding process.

As will be seen herein, the present invention provides a non-adhering "tapeless" or "coating free" protection (e.g., spin-on coating) of front side wafer surfaces by employing a non-adhering protective material which can be reused from wafer to wafer, if desired. By employing the non-adhering securement and protective system according to principles of the present invention, mechanical and chemical stresses imparted to the wafer, associated with de-taping and protective coating removal are avoided, thus providing a substantial increase in product yield, as well as process simplification and reduced cost. Further, these advantages are attained without sacrificing back grinding quality and/or precision. The present invention also eliminates the need for conventional systems for protecting front side wafer surface semiconductor devices during back grinding, e.g., such as adhesive tape material (applied either to the wafer front side surface of the vacuum chuck) and adhesion coatings such as a spun photo resist applied to a front surface of the wafer or work piece.

FIG. 1 depicts a cross-sectional view of a wafer backside grinding system 10 for supporting semiconductor wafers 12, other work pieces and other thin materials during grinding operations according to one embodiment of the present invention. The system 10 includes an upper portion 102 and a lower portion 104. The upper portion 102 includes a grinding abrasive 106 (e.g., grinding pad, wheel, ring, cup or the like) mounted on or in an upper housing 108. In the illustrated embodiment, the grinding abrasive 106 is mounted for movement with respect to the lower portion 104. A top spindle 110 schematically indicates the movable mounting of the grinding abrasive 106. In the illustrated embodiment, the top spindle 110 is centrally located about the axis of the grinding abrasive 106 and the upper housing 108. Preferably, the grinding abrasive 106 can be mounted for movement other than rotationally about the axis of the lower portion 104 as shown in FIG. 1. Preferably, the grinding abrasive 106 can be mounted on the top spindle 110 for rotation about an axis parallel to but laterally displaced from the axis of the lower portion 104. A "cluster" of grinding abrasives or pads may be mounted on various top spindles for movement. This allows a plurality of grinding abrasives to be utilized in some sequence, for example, a coarse grinding abrasive is utilized first, and then a fine or less coarse grinding abrasive can be used, to maximize grinding quality, speed and/or surface finish and improve grinding precision.

The lower portion 104 mounts or supports a wafer or other work piece 12 with an exposed backside surface 16 positioned to face the grinding abrasive 106 of the upper portion 102. A film frame assembly 26 supports the wafer 12 from below and is in turn supported by a vacuum chuck 14. The vacuum chuck 14 is preferably made of a rigid material such as ceramic and includes an upper porous region 38 supported by a lower relatively more dense region 39. The porosity of the porous region can be established by drilling a plurality of bores or holes into the chuck 14. Alternatively, the porous region 38 can be formed of a material that is inherently porous. For example, the porous region can include numerous minute or microscopic pores through which a vacuum signal can be transferred to the support surface. As indicated in FIG. 1, the vacuum chuck 14 has a stepped configuration with the porous region 38 having a smaller diameter relative to the more dense region 39. The vacuum chuck 14 is attached to a backing plate 112 using conventional fasteners. The backing plate is in turn supported by a lower spindle 118.

In order to accomplish a grinding action, relative movement between the grinding abrasive 106 and the wafer 12 is supplied. As indicated, it is generally preferred that the grinding abrasive 106 be mounted for movement with respect to the lower portion 104 and hence the wafer 12. The wafer 12 can be held stationary with the lower spindle 118 being stationary, and/or the wafer 12 may be mounted for movement with respect to upper portion 102. In some embodiments, the lower spindle 118 is additionally or alternatively rotatably driven in the same or a counter direction with respect to movement of grinding abrasive 106.

The vacuum chuck 14 is typically configured through conventional construction transmitting vacuum forces from a vacuum supply (not shown) through a vacuum bore or channel 115 within the lower spindle 118 applying the vacuum force to the front side (or device side) of wafer 12. As mentioned, the upper region 38 of vacuum chuck 14 is porous, and is preferably uniformly porous throughout. The relatively dense region 39, in order to transmit vacuum signals to porous region 38, is provided with vacuum passageways 117, such as holes drilled in the relatively dense region 39, communicating with the vacuum source in the lower spindle 118 through the vacuum channel 115. Vacuum signals or forces are uniformly transmitted throughout the film frame assembly 26, for uniform application to the front side of wafer 12. In this manner, the wafer 12 is held against the lower portion 104 of the backside grinding system 10.

Figure 3:
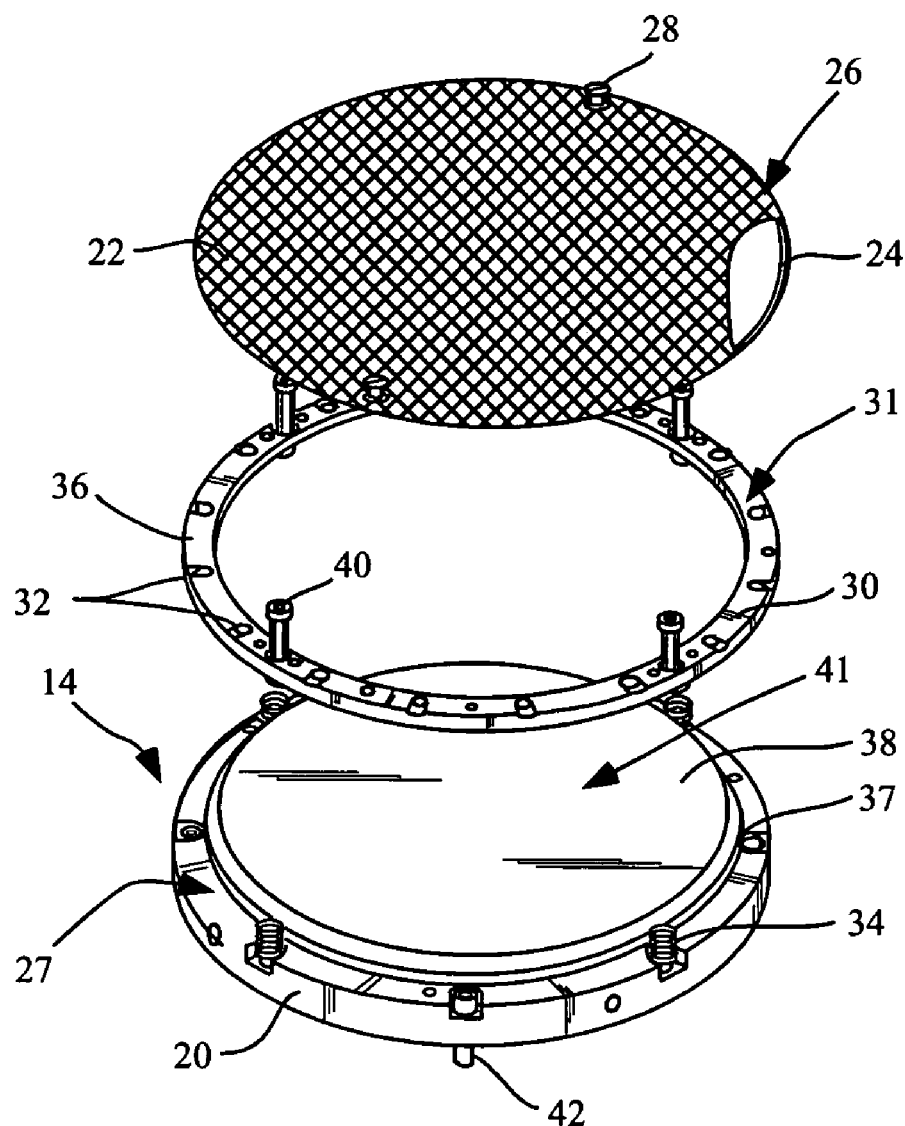
FIG. 3 is an exploded isometric view of a partially cut-a-way frame assembly, a frame holder, a vacuum chuck housing and a vacuum chuck that can be implemented in the grinding system of FIG. 1.

Referring to FIGS. 1 and 3, where FIG. 3 shows an exploded isometric view of a partially cut-a-way film frame assembly 26, a frame holder 30, a vacuum chuck housing 20 and a vacuum chuck 14 implemented in the grinding system of FIG. 1, a support surface 41 of the vacuum chuck 14 provides support for the wafer 12 during grinding. A preferred vacuum chuck 14 includes an upper rigid, porous region 38 (see FIG. 1) supported in a housing 20. The housing 20 is attached to the backing plate 112 (see FIG. 1) by chuck mounting screws 42. The housing 20 in conjunction with the backing plate 112 maintains a negative or vacuum pressure on the work piece or wafer via vacuum connections 115, 117 extending through the chuck 14 and lower spindle 118. A protective material 22 (see FIG. 3), to be described fully below, is preferably mounted to a frame 24. The protective material 22 is typically maintained under tension, in a stretched condition, by the frame 24. The protective material is secured with the frame through substantially any method, including adhesive, mechanical fasteners, magnets, clamps or clamping and other similar methods. As is described in greater detail below, the frame 24 and protective material 22 form a film frame assembly 26 that is removably attached to a frame holder 30. If desired, the frame 24 can be omitted, with the positioning of protective material 22 relative to the chuck 38 being maintained through alternative methods. In one embodiment, the frame 24, the frame holder 30 and/or the housing 20 are formed as laminated rings, such as metal rings.

Figure 2:
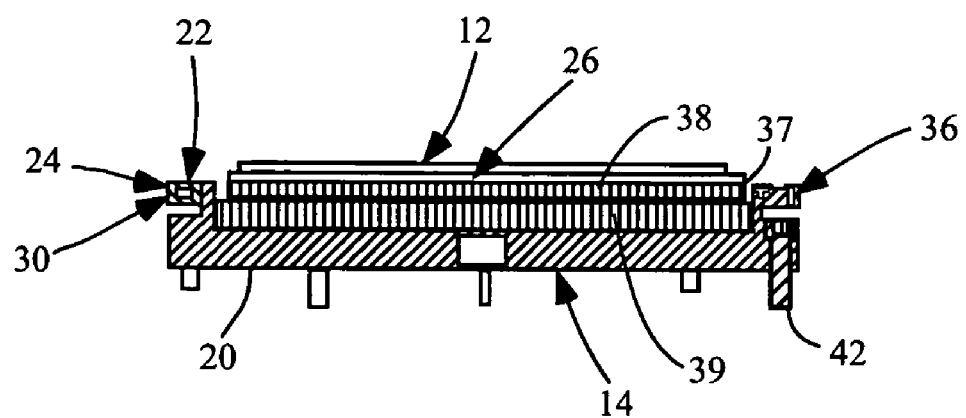
FIG. 2 is a simplified, cross-sectional view of a lower portion of the grinding system of FIG. 1.

Still referring to FIGS. 1–3, a preferred arrangement for securing the wafer 12 with the lower portion 104 of the backside grinding system 10 according to one embodiment is now described. As mentioned, the vacuum chuck 14 has an upper porous region 38 surrounded by and positioned on top of a more dense region 39 (see FIGS. 1 and 5). The vacuum chuck 14 is mounted in a housing 20 dimensioned so as to allow porous region 38 to extend above an upper surface 27 of the housing, as can be seen for example in FIGS. 2 and 3. The housing 20 provides a fastening arrangement to mount a frame holder 30 having, in one embodiment, a generally annular shape with the housing 20 in the manner indicated in FIG. 3. Fasteners 40, such as threaded, magnetic, snap-fit and the like, secure the frame holder 30 with the housing 20. The fasteners 42 secure the housing 20 to a backing plate 112 (see FIG. 1).

The film frame assembly 26 includes a protective material 22 secured to an annular frame 24. Typically, the frame is configured with dimensions greater than the chuck to allow the frame to be positioned around the periphery of the chuck 38. The protective material is secured with the frame 24 through substantially any securing method including, adhesive, clamping and other similar methods. The protective material is preferably secured with the frame in a tensioned and/or stretched state. The amount of tension depends on many factors, such as, the type of material employed, size of the vacuum holes in an unstretched state and in a stretched state, strength, thickness, stiffness and compressibility of the material, the type of work piece to be protected, the expected amount of force to be applied to the work piece, and other similar factors and characteristics.

In one embodiment, the film frame assembly 26 is assembled by applying an adhesive at points around the frame 24 or along the entire frame, a planar force is applied to a protective material (e.g., along an x-axis, along a y-axis, a radial tensile force) to achieve the desired tension on the material, and the material is pressed against the frame 24 and adhesive. The protective material preferably extends across the entire area defined by the frame, where the area defined by the frame is typically greater than the area of the front side surface and/or backside surface of the work piece.

In some embodiments, it is desirable that the film frame assembly 26 is removably installed on the vacuum chuck providing added flexibility, simplified use and enhanced operation. The frame 24 can be secured to a frame holder 30 of the vacuum chuck by a variety of conventional means, e.g., bolts, hook and loop fasteners, adhesives or the like, but is preferably held by magnetic material comprising magnetic members 32 disposed below an upper surface 31 of frame holder 30. Accordingly, it is preferred that the frame 24 contains magnetic material, such as a magnetic stainless steel material, or has magnetic material affixed to it.

The film frame assembly 26 can be quickly and easily removed and replaced with film frame assemblies having protective material of the same or different characteristics. Replacement of the frame 24 and protective material 22 can be performed very quickly, on the order of a minute or so, allowing a wide variety of processing possibilities. For example, different protective materials can be employed at different stages of a process operation. If desired, screws 28 or other fasteners could also be employed as shown in FIG. 3 for removable attachment of the film frame assembly 26 to frame holder 30. If desired, the film frame assembly can be installed on the chuck in a more permanent fashion, in effect dedicating the film frame assembly to the chuck.

A plurality of adjusting springs 34 support the holder 30 on the housing 20. In the preferred embodiment, pins 36 extend from the holder 30. The pins 36 center the frame 24 on the holder 30 and do not allow the frame 24 to move in the same plane as a support surface 41 of the vacuum chuck arrangement 14. The preferred way to remove the frame is to lift it away from the frame holder (normal to the upper surface of the vacuum chuck arrangement 14) breaking magnetic attraction. A plurality of frame holder mounting screws 40 are provided to aid in desired adjustments, and the holder 30 is thereby made resiliently adjustable with respect to the upper surface of the vacuum chuck arrangement 14 disposed within housing 20. The springs 34 allow for readjustment of the holder 30 if the upper surface of the vacuum chuck arrangement 14 changes due to dressing of the chuck 14, for example, without having to remake parts. It has also been noted that the springs 34 allow adjustment for optimizing of protective material tension and hence provide further improvements to grinding results. If desired, the springs 34 can be eliminated.

According to certain aspects of the present invention, the protective material is employed to provide a number of advantages and enhancements, especially beneficial for work pieces comprising semiconductor wafers undergoing back grinding operations. As will be appreciated by those skilled in the art, such wafers are quite expensive, having, for example, undergone a series of demanding operations to form electronic devices at the front side surface of the wafer. In order to attain profitability, a number of objectives regarding the wafer front side surface is to be attained as the wafer undergoes backside thinning, grinding or polishing operations. First, the wafer must be held securely to allow the desired precision grinding or polishing motion to be developed with respect to the wafer backside surface. It is desirable to provide anti-rotation and other anti-motion protection of the wafer.

As pointed out above, certain serious drawbacks are encountered when adhering-type wafer protection is employed. A substantial improvement is provided by the present invention in that protection of the wafer front surface is achieved through a non-adhering manner, e.g., a tapeless protection, as well as a coating-free protection. In the preferred embodiment, the protective material 22 is placed in direct contact with the front side surface of the wafer, but in a non-adhering manner. Preferably, the protective material cooperates with a conventional vacuum chuck to transfer vacuum securement signals from the vacuum chuck to the front side surface of the wafer.

The protective material can provide transference of vacuum signals from the vacuum chuck to the wafer front side surface in a number of ways which allow vacuum signals to be transmitted through the protective material. In a preferred embodiment, the protective material is formed to resemble a woven construction illustrated in the magnified view of FIG. 4.

Still referring to FIG. 3, (and simultaneously to FIG. 2), a chamfer 37 is shown at a peripheral edge of the upper porous region 38. The chamfer 37 serves to reduce the sharpness of the peripheral edge of the upper porous region 38, which is advantageous both for the protective material and an operator. The sharpness of the peripheral edge can be reduced through several methods. In one method, the chuck is rotated and a file or other material removal device is applied to the peripheral edge to taper and/or round the peripheral edge. The peripheral edge is preferably tapered or rounded uniformly about the peripheral edge.

Figure 4:
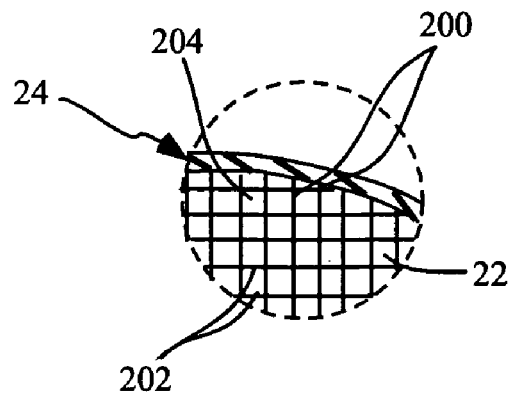
FIG. 4 shows a partial enlarged view of a portion of a protective mesh material of the film frame assembly of FIG. 3.

Referring to FIG. 4, the protective material 22 (for example, a mesh material) can comprise a series of generally parallel extending weft fibers 200 regularly intersecting a series of generally parallel warp fibers 202. The weft fibers 200 intersect the warp fibers 202 to form a cross-hatch or grid pattern. Typically the weft fibers are perpendicular to the warp fibers. Due to the relative spacing of the weft and warp fibers, a series of interstices or vacuum holes or pores 204 are formed. As illustrated in FIG. 4, the weft and warp fibers are arranged to form a regularly spaced, generally rectilinear grid. Preferably, the weft and warp fibers form a regular series of generally square vacuum holes 204.

As less preferred alternatives, the vacuum holes could comprise parallelograms, non-square rectangular openings or openings that are not regularly spaced.

One preferred meshed protective material is commercially available under the trade designation PES polyester material. The most preferable form of the mesh material is designated PES 68/38. However, other mesh materials or other materials having holes or openings can be used. The size of the holes can be substantially any size capable of allowing sufficient vacuum signals to secure the wafer or work piece with the chuck during grinding. In some embodiments, it is preferred that the holes 204 are sufficiently large to allow at least a portion of positive pressure signals to pass through the mesh holes to provide a lifting force to the wafer or work piece as described fully below.

It has been found that the lowest total thickness variation was obtained with mesh materials having relatively small mesh opening and small weave thickness. It has also been found important to consider the thickness of the woven material as distinguished from the thickness of the threads comprising the material, since the weave thickness is a function of thread thickness and mesh opening. Mesh materials chosen according to these parameters have been found to work best with commercial ceramic vacuum chucks, to obtain the lowest total thickness variations.

Attention was paid to the relative size of the mesh openings since it was realized that deflection of the wafer within a mesh opening is an important consideration to obtain critically low total thickness variations. As will be readily appreciated by those skilled in the art, unloading of the wafer from the vacuum chuck, following termination of the vacuum signal, is best accomplished with the introduction of a small positive pressure signal to separate the wafer from its supporting equipment. Due to the configuration of some preferred mesh materials, it was found that at least a portion of the positive pressure signal did not penetrate the mesh and caused a small lifting force between the support or working surface of the ceramic chuck and the mesh material. This was, however, found not to be objectionable and could be readily accepted as a trade off for the improved support offered by mesh materials having a relatively small pore size. In some embodiments, the minimum pore size (measured in some embodiments by an average pore size) is limited by the size of the magnetic force implemented to secure the film frame assembly 26 with the frame holder 30. More specifically, the pore size is configured to be of a sufficient size to allow a sufficient amount of positive pressure signal to pass through the protective material such that the lifting force applied to the protective material does not exceed the magnetic force securing the film frame assembly 26 and frame holder 30 (and in some embodiments, frame holder with the housing 20). However, other fastening methods can be employed allowing increased positive pressure signal providing lift applied to the protective material 22.

As mentioned, it is generally preferred that the protective material 22 be utilized while under tension, which can be achieved, for example, by stretching the protective material across the frame 24. In some embodiments, it is additionally preferred to maintain the desired configuration described above, with the warp and the weft threads of the mesh material being nearly equal in length and normal to each other. It is believed that this arrangement causes substantially equal vacuum pressure and uniform wafer support to be applied across the front side surface of the wafer. Preferably, the size, number and placement of the vacuum holes 204 within the mesh material are predetermined to distribute vacuum pressures evenly across the surface of the wafer. This is believed to ultimately reduce the stresses that may cause cracking or deflection when vacuum forces are applied to secure the wafer to the vacuum chuck. In order to evenly distribute vacuum signals on the front side of the wafer, vacuum holes 204 are preferably configured to be as small as possible. If the mesh material becomes clogged with debris, the protective material (and typically the film frame assembly 26) may be removed, cleaned and reused or replaced.

In an alternative embodiment, the protective material 22 comprises a non-woven fibrous pad having vacuum holes arising from a porous construction i.e. the material is inherently porous by manufacture. There are a wide variety of known materials that possess an inherent porosity or internal open structure having a plurality of holes that allow a vacuum signal applied at one major surface of the protective material to appear at the opposed major surface of the protective material. The protective material 22 can have internal vacuum holes or vacuum pathways which are irregularly formed.

A wide variety of conventional woven and non-woven materials, such as filter media, silk screening (of the type used for silk screen printing), woven textiles and porous polymeric materials can be used with little or no surface preparation.

In a third embodiment, the protective material 22 can be formed from film sheet material which is perforated to form a series of vacuum holes 204 extending through the thickness of the sheet material. Most preferably, the vacuum holes are regularly spaced and have a substantially constant, regular size. The sheet material may be either perforate or imperforate (where a user or technician perforates the sheet before use), with the vacuum holes providing the desired vacuum transference from one major surface to another.

The present embodiment also specifically contemplates the use of relatively nonporous protective materials or sheets that are perforated to the degree needed to transmit the required vacuum signal to the wafer being processed, in order to ensure that the wafer is held steady during grinding. Examples include polymeric, paper-based materials, as well as a variety of plastic materials and compositions. In general, it is preferred that the material chosen has a homogeneity throughout, so that the properties are the same regardless of position on the chuck and do not adversely affect grinding results. Perforated sheet materials can be constructed so as to have a greater resistance to torsional distortion caused by relatively large grinding forces imparted to the wafer held in vacuum contact with the protective material.

In a further embodiment, the vacuum holes 204 may be shaped as rings or finite regions aligned with the vacuum holes within a wafer holder to prevent water or other liquids from migrating underneath the surface of the protective material.

Figure 5:
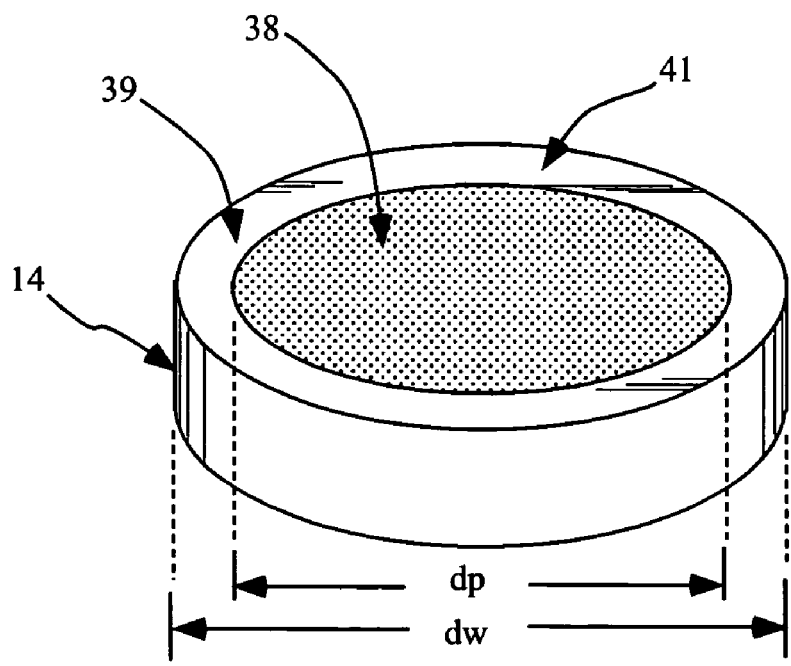
FIG. 5 depicts an isometric view of an upper porous region of a chuck that can be implemented in the grinding system of FIG. 1.

FIG. 5 depicts an isometric view of an upper porous region of a chuck 14 that can be implemented in the grinding system 10 of the present embodiment. The chuck includes a porous region 38 surrounded by a non-porous region 39. The diameter dp of the porous region is less than the diameter of the support or work surface dw. Typically, the diameter of the porous region dp is additionally less than the diameter of a wafer or other work piece 12 to be ground in the grinding system 10. Further, the diameter of the support surface 41 is typically greater than the diameter of the wafer. As such, in some embodiments, the perimeter of the wafer extends beyond the porous region 38 and rests on the non-porous region 39.

When the vacuum force is applied to the wafer 12 from the porous region, a seal results between the front surface of the wafer 12 and the non-porous region 39, securing the wafer with the support surface. One advantage to this implementation is that the resulting seal significantly reduces the amount of dust, swarf and other materials that are deposited into the pores of the porous region 38.

The protective material is further configured to provide protection (and optionally cushioning), to prevent damage to the wafer front side surface arising from contact forces associated with the vacuum chuck during grinding. Although not necessary, it is generally desirable that the protective material be resiliently compressible to a minimal extent to absorb localized forces while preventing the wafer from "bottoming out" against the vacuum chuck or grinding non-uniformly.

In some preferred embodiments (for example, as illustrated in FIGS. 3 and 4), the protective material is made of polymeric material, such as woven polyester fibers, generally round in a cross-section, having a diameter in one embodiment of approximately 40 microns. Other materials such as nylon, Teflon, cotton, linen and other such materials can also be used. The thickness of material fibers can range, in some embodiments, between 30 to 500 µm, and the fiber pad thickness can range between 30 to 1200 µm. A variety of cross-sectional shapes for the fibers woven to form the protective material can be employed, for example circular, square, rectangular, oval, elliptical and other similar shapes. Further, the compressibility, surface tension, surface friction and (other properties) can be varied with known, conventional coatings applied to the fibers, to the protective material and/or the chuck 38.

The protective material 22 most preferably comprises a uniformly porous material throughout. The preferred uniformly porous quality allows the vacuum forces developed within the interior of housing 20 to be uniformly spread across the semiconductor wafer or other work piece being ground, and to be sufficient to adequately retain the semiconductor wafer or other work piece for the desired operation, e.g., polishing or grinding. For example, different forces and directions of motion are to be adequately restrained.

With the present invention, appropriate, optimum materials for protective material 22 can be chosen for different grinding requirements. For example, the material of the protective material 22 can be selected according to porosity characteristics, thickness characteristics, and stiffness to further improve process results. For example, relatively hard protective materials such as stainless steel may improve total thickness variation. As a further example, when global planarity or other dimensional accuracy and stability are required, the present embodiment allows the use of a wider range of relatively hard materials. However, the use of harder protective materials may, in certain conditions, increase the risk of interfering with the front surface of the wafer or other work piece being processed. For example, harder materials may give rise to electrical faults and/or device shapes may be impressed on the backside of the wafer during grinding where devices on the front side push up when pressure is applied. In such instances, softer and more compressive protective materials can be employed to accommodate work pieces, such as work pieces having bumps or other surface features which must not be reflected in the surface being worked on. With the present embodiment, a wide variety of different protective materials can be readily incorporated in the process operation with a minimal, almost negligible setup time requirement.

Mounting techniques for these protective materials may employ an application of an adhesive layer to the protective material and/or to chuck 38.

In some embodiments, the protective material 22 may be placed under tension, giving rise to new possibilities heretofore unavailable to the manufacturers and users of polishing and grinding equipment. For example, with the present embodiment, the protective material 22 can be manufactured with increased thickness and employed in a heretofore unattainable thinness due to stretching. Material placed under tension is less likely to deform when one of its major surfaces is placed under substantial shear loading. With the present embodiment, the possibility of employing materials that are otherwise unacceptably "softer", more compressible or otherwise excessively deformable arises.

With the present invention, a wide variety of heretofore unattainable material characteristics can be readily achieved using conventional low-cost materials. For example, materials that are unacceptably softer can be greatly reduced in thickness and thus made to appear to have a harder or less resilient characteristic, while retaining desirable (i.e., negligible) surface characteristics. For example, an otherwise unsatisfactory compressible material can have surface structures that provide a desired cushioning and frictional characteristic. This otherwise unsatisfactory compressible material, now placed under tension, is continuously supported and dimensionally controlled throughout its surface. Further, a heretofore unavailable reduction in material thickness is made possible. Protective materials that would otherwise tear or shred when secured with a support surface by an adhesive now performs in a different acceptable manner when the material is positioned over the support surface under tension without adhesive.

The porosity of the material can be selectively controlled in a number of different ways. For example, the material can be made to be continuously uniform throughout, as with a textile having a uniform structure. With the present embodiment, the material can be made to have a discontinuously uniform porosity, i.e. porous sites which are unevenly spaced one from another, but which present an overall uniformity from a gross perspective. As a further possibility, porosity of the material can be grossly nonuniform as where uniformly spaced circles of pores are provided so as to emphasize vacuum strength at either the outer periphery or the center of a work piece. In any event, the protective material 22 preferably has a minimum porosity to assure that an adequate vacuum signal from the vacuum chuck (i.e. adequate in both strength and dimensional pattern) reaches the work piece being processed. Some protective materials are selected with vacuum holes smaller than desired, because under tension the sizes of the vacuum holes increase to a desired size.

In some embodiments, it is desirable to prevent the protective material from adhering to the wafer front side surface. While adherence may not impair a wafer during grinding, breaking the bonds or forces associated with such adherence in a post-grinding operation will inevitably impart mechanical stresses to the wafer in a fragile condition. Rather than employing such arrangements, it has been found important to avoid adherence of the protective material to the wafer throughout the grinding operation. Certain steps can be taken to avoid the tendency of the protective material to adhere to the front side surface. For example, coatings can be applied to the protective material to limit and preferably eliminate the tendency of the protective material adhering to the front side surface. Silicone or static dissipative coatings or Teflon may be advantageous in this regard.

Figure 6:
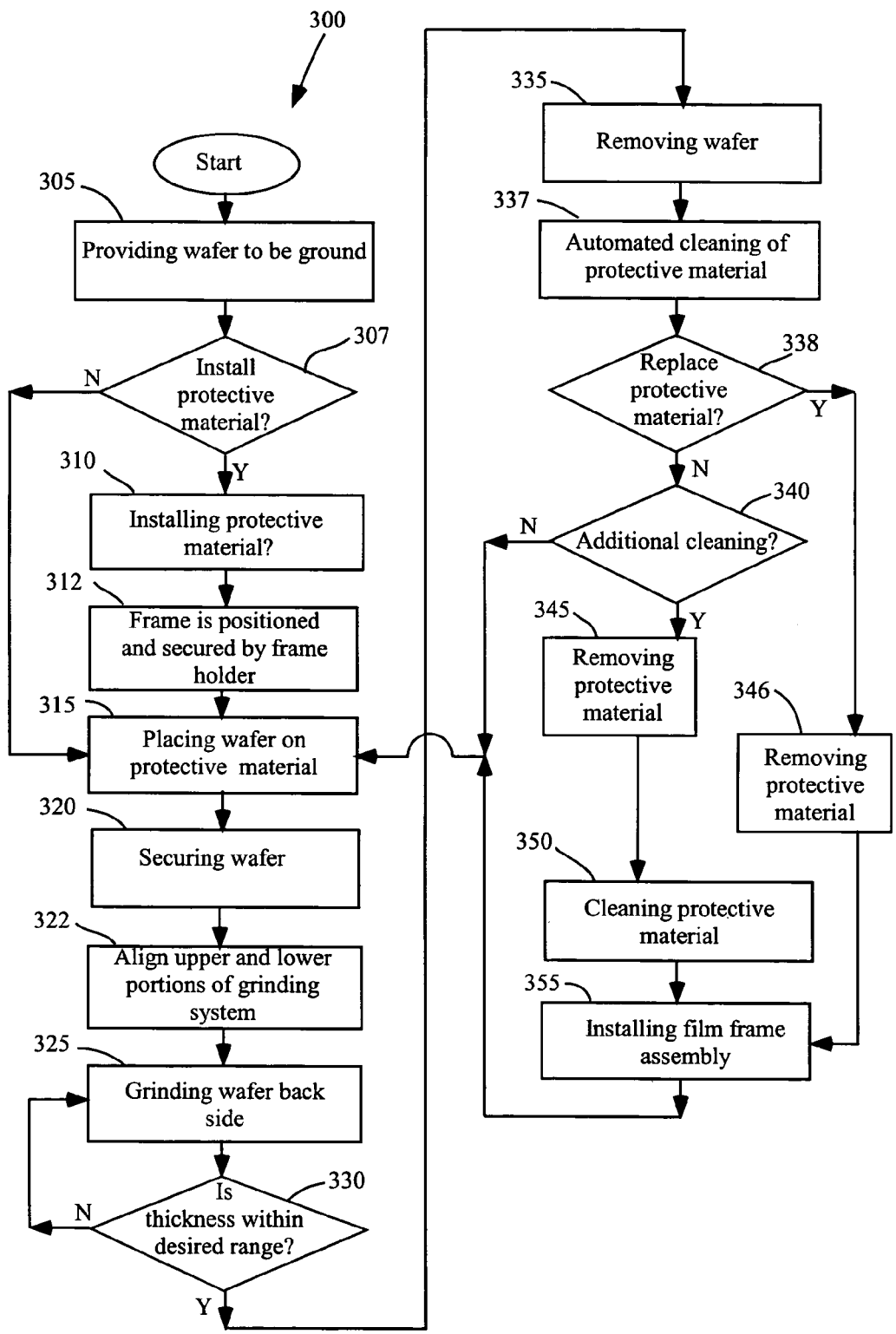
FIG. 6 is a schematic flow diagram illustrating a backside grinding method according to principles of one embodiment of the present invention that may be carried out using the apparatus of FIGS. 1 through 5.

FIG. 6 depicts a process 300 of using a reusable mesh material, film mesh or other protective material in a grinding system 10. Referring to FIG. 6 and additionally to FIGS. 1 and 3, in step 305, a wafer or other work piece 12 is provided where one or more sides of the wafer are to be ground. In the instance where a wafer is to be back ground, the wafer has a front side that typically has been previously processed to include circuitry, and a backside that is to be ground. In step 307, it is determined if a new protective material is to be positioned over a vacuum chuck. If a protective material is already positioned over the chuck, the process 300 proceeds to step 315. If a protective material is not positioned over the chuck, the process proceeds to step 310 where the protective material is placed and secured within the protective material frame 24. In some instances a technician, operator or engineer places the protective material 22 into the frame 24 and secures the protective material to the frame, using clamping, adhesive or other methods for securing. Typically, the protective material is secured in a stretched or taut condition. Alternatively, the protective material and frame may have been previously assembled or purchased from a manufacturer in an assembled state.

In step 312, the frame 24 is positioned and secured within a frame holder 30 that has previously been secured with the housing 20 and chuck 38 using fasteners 40, springs 34, chuck mounting screws, 42, magnets and/or other means for securing. For example, the frame can be positioned using pins 36 in the holder that align with pin recesses or apertures (not shown) in the frame 24. The frame can additionally, or alternatively, be positioned and secured using magnets 32 in the frame holder 30 and/or the frame 24. Other methods for securing the frame within the holder can alternatively or additionally be used, such as safety screws, clamps, snap-fit or the like.

In step 315, the wafer 12 is positioned onto the protective material 22 and vacuum chuck. Conventional handling techniques are typically used to transport the wafer 12 onto the protective material 22 and thus into the grinding system 10 (typically robotics are utilized to move the wafer on to the protective material and vacuum chuck). In step 320, a vacuum force is applied through the porous ceramic surface of the vacuum chuck 38 and through the vacuum holes 204 of the protective material 22 to be applied to the front side surface of the wafer 12, maintaining the positioning of the wafer on the vacuum chuck and the protective material.

In step 322, the upper portion 102 and lower portion 104 of the grinding system 10 are moved relative to one another such that the grinding abrasive 106 engages with the wafer 12. The engagement can be achieved through any number of methods. For example, the upper portion 102 and grinding abrasive 106 can be moved into engagement with a stationary lower portion 102, the lower portion can be moved into engagement with a stationary upper portion or both the lower and upper portions can be moved to achieve engagement. In step 325, the grinding abrasive and/or wafer is rotated and the grinding abrasive is brought into contact with the wafer by moving the grinding abrasive and/or the wafer to grind the backside of the wafer to achieve a desired wafer thickness. An automated process using preprogrammed parameters rotates the top spindle 110, causing the grinding abrasive 106 to rotate and grind the backside of the wafer 12. Typically, the grinding abrasive is rotated at a predefined rotational speed, and the grinding abrasive 106 is caused to contact the wafer at a predefined pressure. In some embodiments, the grinding step 325 includes utilizing a plurality of different grinding abrasives. For example, two or more grinding abrasives, each having a different coarseness, can be employed to achieve precise grinding rates, desired thickness and/or surface finish to within predefined tolerances.

In step 330, it is determined if the wafer has been ground to a desired thickness or within a predefined tolerance of the predefined thickness. Based on predetermined parameters, an operator, technician or automated process uses conventional metrology equipment to measure the thickness of the wafer 12 to determine whether the wafer has been ground to product specifications. If grinding is incomplete, the process 300 returns to step 325 to further grind the wafer. If it is determined the wafer meets the desired thickness, the process proceeds to step 335. In step 335, the grinding abrasive 106 and wafer are separated and rotation of the top spindle 110 is stopped (if not previously separated and/or stopped for thickness measuring). The vacuum pressure is also removed from the vacuum chuck, and simultaneous conventional handling techniques are used to lift the wafer 12 from the surface of the protective material 22 and to transfer the wafer to a successive operation. In some embodiments of step 335, a positive pressure signal is applied to aid in separating the wafer from the protective material.

In step 337, the protective material is cleaned, typically through an automated process. In step 338, it is determined if the protective material needs to be replaced (for example, because the protective material is damaged, too clogged or dirty to adequately clean, has been used for a predefined number of grindings, when a new protective material is utilized in the grinding of each wafer or other similar criteria). If replacement is needed, the process proceeds to step 346 for removal of the protective material and then to step 355. If replacement is not necessary, step 340 is entered where it is determined if additional cleaning of the protective material is needed. The determination of additional cleaning is determined by inspection by an operator, technician or an automated process. For example, the protective material can be inspected to determine if the protective material is clogged with debris to a level that can potentially impede optimum performance. If additional cleaning is not needed, the process 300 returns to step 315 for grinding of another wafer or work piece. If additional cleaning is needed, the process 300 proceeds to step 345.

In step 345, the protective material 22 is removed by an operator or technician from the grinding system 10. Securing the protective material with the readily removable frame 24 speeds the step of removing the material from the system 10. In step 350, an operator, technician or automated process cleans the protective material, in some embodiments using conventional cleaning techniques, to remove the buildup of debris embedded in the vacuum holes 204 of the protective material 22 (see FIG. 4). Following step 350 or step 346, where it was determined that the protective material needed replacing and was removed, step 355 is entered where an operator or technician installs the cleaned (or new) protective material 22 into the grinding system 10. Following step 355, the process 300 returns to step 315 to continue grinding another wafer or work piece.

Figure 7:
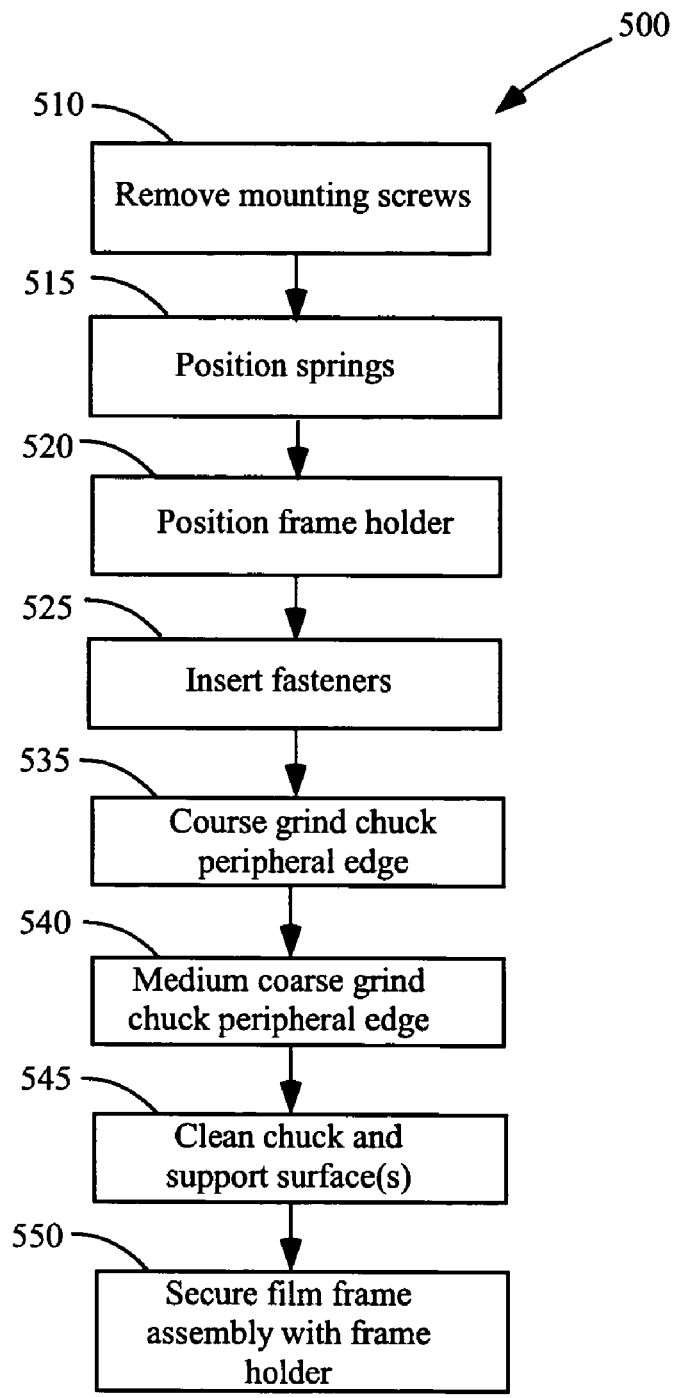
FIG. 7 depicts a simplified flow diagram of an example process for retro-fitting an existing chuck to be utilized with one embodiment of the present invention, such as the system shown in FIG. 1.

FIG. 7 depicts a simplified flow diagram of an example process 500 for retro-fitting an existing chuck to be utilized with the present embodiment. In step 510, a plurality of and preferably every other chuck mounting screw or socket head cap screw (SHCS) holding the work chuck of a previous grinding system to a work chuck mounting plate are removed. With some previous grinding systems, this step results in four screws remaining that are equally spaced at 90 degrees. In step 515, a spring 34 (see FIG. 3) is positioned into each counter bore or hole vacated by the removal of the screws. In step 520, the frame holder 30 is positioned on the springs. In step 525, a fastener 40, such as a low head SHCS, is inserted into holes within the frame holder, through the springs and into each of the vacated holes. Each fastener 40 is tightened such that the frame holder is below the support surface 41 of the chuck 38. In some embodiments, frame holder is tightened to be a predefined distance below the support surface (for example, 0.120 inches below the support surface).

In step 535, the chuck is rotated, typically by hand while applying a coarse grid diamond honing tool on the peripheral edge of the chuck and pivoting the tool on the peripheral edge. For example, a 250 grit diamond tool can be used and the chuck can be rotated approximately 40 revolutions. In step 540, the chuck is again rotated while applying a medium grit diamond honing tool (e.g., 400 grit) to the peripheral edge. In step 545, the chuck and support surface are cleaned. In step 550, the film frame assembly 26 is secured with the frame holder 30 such that there preferably no gaps between the frame holder and the film frame assembly and magnets 32 have a strong grip on the frame 24.

It will now be appreciated that the embodiments described herein above provide a number of heretofore unattainable advantages, both for equipment manufacturers, as well as operators of grinding and polishing equipment. With the present embodiment, wafer surfaces are maintained in a cleaner condition, free of contamination from adhesive components and residues. Thus, the need for more rigorous and potentially destructive adhesive removal operations do not arise from the work piece processing, further adding to the efficiencies resulting from avoiding taping and de-taping operations. Further, it is well known that de-taping operations impart flexural stresses to thinner work pieces. This can have significant impact when the work piece comprises a semiconductor wafer, particularly Gallium-Arsenide (GaAs) wafers which are known to often exhibit heightened brittleness. As a result, greater efficiencies and yield levels are enjoyed when grinding and other backside surface operations are carried out according to principles of the present embodiment.

A further advantage of the embodiments described herein above over the use of adhesive tape adhered directly to the support surface 41 of the chuck 38 is that in testing, a greater total thickness variation is observed with adhesive tape. Also, when the adhesive is employed, a residue typically remains on the chuck when the tape material is removed. Also, installation of the protective material is more costly in that additional time is required to remove air bubbles and wrinkles in the tape during application to the chuck. It will now be appreciated that the present invention provides a number of heretofore unattainable advantages, both for equipment manufacturer, as well as operators of previous grinding equipment. Cost advantages are realized in that protective tape that has to be adhered to work pieces (e.g., wafers), and which lasts only for a single application is eliminated by the present embodiment. Further, machines required to apply and to remove protective tape are also eliminated.

In another useful embodiment, the present apparatus and method facilitates the use of special protective materials or tapes attached to the front surface of a wafer or work piece, which have desirable properties other than for back grinding protection. In this way these special tapes can be accommodated during back grinding since the method described herein provides back grinding protection. For example, if wafers to be ground are partial depth pre-cut individual semiconductor dies, then the front devices may be held together for further processing by a thin, high-temperature resistant tape, which high-temperature tape is by itself not suitably compliant to protect the devices on the front side during grinding. The present embodiment, with the protective material 22, makes back grinding possible while still utilizing special tape such as the high-temperature tape and other special tapes and materials.

The protective materials 22 employed in the present invention typically have a useful life extending over many operating cycles of the grinding equipment. In tests, as many as, for example, 200 work pieces are processed using a single item of protective material. In some embodiments, relatively delicate super-thin work pieces can now be subjected to commercially acceptable grinding operations without risk of breakage arising from removal of protective tape. Since the use of protective tape applied with adhesive on the work piece is eliminated, adhesive residue left on the work pieces is also eliminated. As emphasized above, with the present invention, advantages of heretofore unavailable materials can be sought for improvement of grinding and super thinning processes.

In other aspects, the present invention provides labor savings in that the protective material can now be replaced with a quick-change feature and protective materials of reduced cost (often prefabricated) can now be used.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. An arrangement for supporting a work piece having opposed first and second surfaces while operations are carried out on the first, surface, to protect the second surface, comprising:
 a vacuum chuck having a support surface, the vacuum chuck being at least partially porous to allow passage of a vacuum signal therethrough;
 a frame;
 a porous protective material held by the frame;
 said frame and said protective material together comprising a frame assembly;
 a frame holder to hold the frame assembly to the vacuum chuck; and a fastening arrangement to fasten the frame holder to the vacuum chuck adjacent the support surface allowing passage of the vacuum signal from said vacuum chuck through said protective material to said work piece.

2. The arrangement of claim 1 wherein the frame holder releasably holds the frame assembly.

3. The arrangement of claim 2 further comprising magnetic material on said frame holder to hold said frame to said frame holder.

4. The arrangement of claim 1 wherein said frame includes a ring-shaped body.

5. The arrangement of claim 1 wherein said frame comprises a plurality of laminated rings.

6. The arrangement of claim 1 wherein said protective material is secured to said frame with an adhesive.

7. The arrangement of claim 1 wherein said protective material is held under tension by the frame.

8. The arrangement of claim 1 wherein said protective material comprises a polymeric film mesh.

9. The arrangement of claim 1 wherein said protective material comprises a woven fabric.

10. The arrangement of claim 1 wherein said protective material comprises a fabric with vacuum holes defined by warp and weft fibers.

11. The arrangement of claim 10 wherein said vacuum holes are arranged in a regularly spaced pattern.

12. The arrangement of claim 1 wherein said work piece comprises a semiconductor wafer of predetermined size.

13. The arrangement of claim 1 wherein said protective material comprises a film sheet that is perforated to form vacuum holes.

14. The arrangement of claim 13 wherein said film sheet is generally non-porous prior to being perforated.

15. The arrangement of claim 1 wherein said fastening arrangement comprises a plurality of threaded fasteners securing said frame holder to said vacuum chuck and a plurality of springs between said frame holder and said fastening arrangement.

16. The arrangement of claim 15 further comprising a plurality of pins extending from said frame holder and received in a plurality of openings defined by the frame.

17. The arrangement of claim 1, wherein the protective material is a non-adhering material.

18. A method of back grinding a semiconductor wafer having an initial thickness, a front side surface with circuitry and an opposed backside surface, comprising the steps of:
providing a protective material having a first surface for contact with the front side surface of said wafer;
providing a vacuum chuck having a support surface, the vacuum chuck being at least partially porous to allow passage of the vacuum signal therethrough;
placing said protective material in contact with said support surface;
placing the front side surface of said wafer in contact with the first surface of said protective material wherein the protective material extends at least over an entire surface area of the front side surface of the wafer;
applying the vacuum signal through said protective material with said vacuum chuck to thereby communicate the vacuum signal with the front side surface of said wafer securing the wafer with the vacuum chuck;
processing the backside surface of said wafer;
removing the vacuum signal to release said wafer; and
removing said wafer from said protective material.

19. A method of back grinding a semiconductor wafer having an initial thickness, a front side surface with circuitry and an opposed backside surface, comprising the steps of:
providing a protective material having a first surface for contact with the front side surface of said wafer;
providing a vacuum chuck having a support surface, the vacuum chuck being at least partially porous to allow passage of the vacuum signal therethrough;
placing said protective material in contact with said support surface;
placing the front side surface of said wafer in contact with the first surface of said protective material;
applying the vacuum signal through said protective material with said vacuum chuck to thereby communicate the vacuum signal with the front side surface of said wafer securing the wafer with the vacuum chuck;
processing the backside surface of said wafer;
removing the vacuum signal to release said wafer;
removing said wafer from said protective material;
providing a frame;
securing the protective material to the frame; and
securing the frame to the vacuum chuck.

20. The method of claim 19 wherein the step of securing the protective material to the frame comprises stretching the protective material on said frame.

21. The method of claim 19 wherein the step of securing the protective material to the frame comprises the steps of providing an adhesive and securing the protective material to the frame with said adhesive.

22. The method of claim 19 wherein the step of securing the frame to the vacuum chuck comprises the steps of:
providing a frame holder having magnetic material; and
securing the frame holder to said vacuum chuck, whereby said frame is releasably secured to said vacuum chuck.

23. The method of claim 22 wherein the step of securing the frame holder to said vacuum chuck comprises the step of resiliently securing the frame holder to said vacuum chuck.

24. A method of back grinding a semiconductor wafer having an initial thickness, a front side surface with circuitry and an opposed backside surface, comprising the steps of:
providing a protective material having a first surface for contact with the front side surface of said wafer;
providing a vacuum chuck having a support surface, the vacuum chuck being at least partially porous to allow passage of the vacuum signal therethrough;
placing said protective material in contact with said support surface;
placing the front side surface of said wafer in contact with the first surface of said protective material;
applying the vacuum signal through said protective material with said vacuum chuck to thereby communicate the vacuum signal with the front side surface of said wafer securing the wafer with the vacuum chuck;
processing the backside surface of said wafer;
removing the vacuum signal to release said wafer; and
removing said wafer from said protective material;
wherein the step of providing said protective material comprises the steps of providing a fabric having warp and weft fibers, and defining a series of vacuum holes with the warp and weft fibers.

25. The method of claim 24 further comprising the step of arranging said vacuum holes in a regularly spaced, generally rectilinear grid.

26. The method of claim 18 wherein the step of providing said protective material comprises the steps of providing a protective film sheet and perforating said film sheet to form vacuum holes.

27. A method for use in assembling a frame assembly capable of use in protecting a wafer during processing, comprising:

applying a tensile force to a protective material,
positioning the protective material over a frame, wherein the frame has an area greater than an area of a wafer;
securing the protective material with the frame; and
applying an adhesive about a surface of the frame, wherein the securing the protective material with the frame includes securing the protective material with the adhesive;
wherein the applying the tensile force includes applying the tensile force at a predefined level to achieve pores within the protective material with an average pore size being of at least a predefined pore size limit.

28. An apparatus for use in protecting a semiconductor wafer during processing, comprising:

a frame;
a porous protection material secured across the frame, wherein the protection material has an area greater than an area of a first surface of the semiconductor wafer; and
a frame holder comprising a plurality of pins extending from said frame holder defining positioning of said frame with said frame holder, and fasteners extending from said frame holder to secure said frame holder with a housing;
wherein the protective material is perforated such that the protective material is porous and the protective material is non-porous prior to being perforated.

* * * * *

UNITED STATES PATENT AND TRADEMARK OFFICE
CERTIFICATE OF CORRECTION

PATENT NO. : 7,018,268 B2  Page 1 of 1
APPLICATION NO. : 10/249433
DATED : March 28, 2006
INVENTOR(S) : Kassir et al.

It is certified that error appears in the above-identified patent and that said Letters Patent is hereby corrected as shown below:

Claim 1, column 16, line 57, after "first" delete "," (comma).

Signed and Sealed this

Twelfth Day of December, 2006

JON W. DUDAS
*Director of the United States Patent and Trademark Office*